United States Patent
Mueller-Meskamp et al.

(10) Patent No.: US 11,183,452 B1
(45) Date of Patent: Nov. 23, 2021

(54) TRANSFERING INFORMATIONS ACROSS A HIGH VOLTAGE GAP USING CAPACITIVE COUPLING WITH DTI INTEGRATED IN SILICON TECHNOLOGY

(71) Applicant: Infineon Technologies Austria AG, Villach (AT)

(72) Inventors: Lars Mueller-Meskamp, Dresden (DE); Berthold Astegher, Villach (AT); Hermann Gruber, Wörth an der Donau (DE); Thomas Christian Neidhart, Klagenfurt (AT)

(73) Assignee: Infineon Technologies Austria AG

( * ) Notice: Subject to any disclaimer, the term of this patent is extended or adjusted under 35 U.S.C. 154(b) by 0 days.

(21) Appl. No.: 16/991,342

(22) Filed: Aug. 12, 2020

(51) Int. Cl.
    *H01L 23/522* (2006.01)
    *H01L 49/02* (2006.01)
    *H01L 29/06* (2006.01)

(52) U.S. Cl.
    CPC .......... *H01L 23/5223* (2013.01); *H01L 28/91* (2013.01); *H01L 29/0649* (2013.01)

(58) Field of Classification Search
    CPC .. H01L 23/5223; H01L 28/91; H01L 29/0649
    USPC ........ 257/532, 536, 296, 301, 310, E27.011, 257/E27.048, E27.081, E27.112, E29.023, 257/E29.346, E21.09, E21.409, E21.546, 257/E21.549; 438/359, 386, 424, 155
    See application file for complete search history.

(56) References Cited

U.S. PATENT DOCUMENTS

| 929,091 | A | 7/1909 | James |
| 6,728,113 | B1 | 4/2004 | Knight et al. |
| 7,663,173 | B1* | 2/2010 | Desai ................. H01L 27/1203 257/300 |
| 8,269,265 | B2* | 9/2012 | Krutsick ................ H01L 21/84 257/301 |
| 8,310,061 | B2 | 11/2012 | Chandrasekaran |
| 8,338,930 | B2 | 12/2012 | Rofougaran |
| 8,525,245 | B2 | 9/2013 | Erickson et al. |
| 9,299,655 | B2 | 3/2016 | Moghe et al. |
| 2003/0057487 | A1 | 3/2003 | Yamada et al. |
| 2004/0046207 | A1 | 3/2004 | Dennard et al. |
| 2004/0108552 | A1 | 6/2004 | Azuma et al. |
| 2004/0248363 | A1 | 12/2004 | Bard et al. |
| 2005/0037582 | A1 | 2/2005 | Dennard et al. |
| 2006/0163635 | A1 | 7/2006 | Aitken et al. |

(Continued)

*Primary Examiner* — Dao H Nguyen
(74) *Attorney, Agent, or Firm* — Design IP

(57) ABSTRACT

A multi-voltage domain device includes a semiconductor layer including a first main surface, a second main surface arranged opposite to the first main surface, a first region including first circuitry that operates in a first voltage domain, a second region including second circuitry that operates in a second voltage domain different than the first voltage domain, and an isolation region that electrically isolates the first region from the second region in a lateral direction that extends parallel to the first and the second main surfaces. The isolation region includes at least one deep trench isolation barrier, each of which extends vertically from the first main surface to the second main surface. The multi-voltage domain device further includes at least one first capacitor configured to generate an electric field laterally across the isolation region between the first region and the second region.

27 Claims, 7 Drawing Sheets

(56) References Cited

U.S. PATENT DOCUMENTS

| | | | |
|---|---|---|---|
| 2008/0290461 A1* | 11/2008 | Moens | H01L 21/76224 |
| | | | 257/536 |
| 2009/0184357 A1 | 7/2009 | Wu | |
| 2010/0302854 A1 | 12/2010 | Wu et al. | |
| 2011/0018094 A1 | 1/2011 | Chapman et al. | |
| 2011/0018995 A1 | 1/2011 | Hazzani et al. | |
| 2011/0241092 A1 | 10/2011 | Khemka et al. | |
| 2011/0291169 A1 | 12/2011 | Ervin et al. | |
| 2012/0012971 A1 | 1/2012 | Kwon et al. | |
| 2012/0104547 A1 | 5/2012 | Ervin et al. | |
| 2012/0267752 A1 | 10/2012 | Erickson et al. | |
| 2012/0268160 A1 | 10/2012 | Erickson et al. | |
| 2012/0306049 A1 | 12/2012 | Booth, Jr. et al. | |
| 2013/0146959 A1* | 6/2013 | Cheng | H01L 29/94 |
| | | | 257/310 |
| 2013/0175594 A1* | 7/2013 | Basker | H01L 27/1203 |
| | | | 257/301 |
| 2016/0043088 A1* | 2/2016 | Cartier | H01L 27/10882 |
| | | | 257/303 |

\* cited by examiner

TRANSFERING INFORMATIONS ACROSS A HIGH VOLTAGE GAP USING CAPACITIVE COUPLING WITH DTI INTEGRATED IN SILICON TECHNOLOGY

BACKGROUND

Integrated circuits for applications in power electronics frequently need to provide an electrical isolation between any electric potential on the parts of the circuits operating high voltages and the lower voltage side of the circuit that interfaces with the user or any other more general control circuit. Moreover, isolation might also be required between different voltage domains on a microchip. Frequently, full galvanic isolation is required between different voltage domains on the microchip, but still it is desired to exchange information or even power between such different voltage domains that have to maintain the requirements of the electrical insulation.

Capacitive couplers placed between the different voltage domains may be used to transmit information. Capacitive couplers having planar (i.e., horizontal) electrodes are usually constructed in the back end of line (BEOL) layer stack of the chip using metal and dielectric layers disposed on a main surface of the chip (e.g. resulting in a capacitance between metal layer 1 and metal layer 4 of the BEOL layer stack). The electric field between the capacitor electrodes is formed vertically in the BEOL layer stack, perpendicular to the main surface of the chip. If the insulation requires higher voltage ratings, additional metal and/or dielectric layers can be added vertically to the BEOL layer stack on top of the microchip to achieve the desired isolation (e.g., a high dielectric thickness between the planar electrodes of the capacitor).

For example, a first planar electrode may be formed in the BEOL layer stack proximate to the main surface of the front-end-of-line (FEOL) portion of the chip, then an oxide layer with desired thickness may be deposited on top of the first planar electrode, and an additional metal layer is added on top of the oxide layer to form the second planar electrode of the capacitive coupler. Not only do these planar electrodes require large areas, if a different voltage insulation is required the thickness (i.e., the vertical dimension) of the insulator layer between planar electrodes must be adjusted. Thus, a change in the manufacturing process for the BEOL layer stack is needed to accommodate difference types of devices with different voltage domain requirements and, thus, different isolation requirements. These vertical arrangements to accommodate different levels of isolation are thus costly and inefficient from a manufacturing point of view and are not practical for multi-voltage domain processing.

Therefore, an improved device having a signal transmission system for multi-voltage domain devices that more easily and economically scales with different voltage isolation requirements may be desirable.

SUMMARY

Embodiments provide a multi-voltage domain device having a semiconductor layer including a first main surface and a second main surface arranged opposite to the first main surface. The semiconductor layer includes: a first region including first circuitry that operates in a first voltage domain, a second region including second circuitry that operates in a second voltage domain different than the first voltage domain, and an isolation region that electrically isolates the first region from the second region in a lateral direction that extends parallel to the first and the second main surfaces. The isolation region includes at least one deep trench isolation barrier, each of which extends vertically from the first main surface to the second main surface, and the isolation region defines a first sidewall of the first region and a second sidewall of the second region that faces the first sidewall. The multi-voltage domain device further includes a wafer insulator layer including a third main surface and a fourth main surface arranged opposite to the third main surface, wherein the second main surface of the semiconductor layer is arranged at the third main surface of the wafer insulator layer, and each of the at least one deep trench isolation barrier extends vertically from the first main surface to the third main surface, wherein the wafer insulator layer electrically isolates the first region from the second region. The multi-voltage domain device further includes at least one first capacitor configured to generate an electric field laterally across the isolation region between the first region and the second region, wherein the at least one first capacitor includes a first electrode arranged at the first sidewall and a second electrode arranged at the second sidewall and capacitively coupled to the first electrode, wherein the first electrode and the second electrode are laterally separated by the at least one deep trench isolation barrier.

Embodiments provide a multi-voltage domain device having a semiconductor layer that includes a first main surface and a second main surface arranged opposite to the first main surface. The semiconductor layer includes a first region including first circuitry that operates in a first voltage domain, a second region including second circuitry that operates in a second voltage domain different than the first voltage domain, and an isolation region that electrically isolates the first region from the second region in a lateral direction that extends parallel to the first and the second main surfaces, wherein the isolation region includes a plurality of deep trench isolation barriers, each of which extends vertically from the first main surface to the second main surface, and wherein the isolation region defines a first sidewall of the first region and a second sidewall of the second region that faces the first sidewall. The multi-voltage domain device further includes a wafer insulator layer including a third main surface and a fourth main surface arranged opposite to the third main surface, wherein the second main surface of the semiconductor layer is arranged at the third main surface of the wafer insulator layer, and each of the plurality of deep trench isolation barriers extends vertically from the first main surface to the third main surface, wherein the wafer insulator layer electrically isolates the first region from the second region. The multi-voltage domain device further includes at least one first capacitor configured to generate an electric field laterally across the isolation region, wherein the at least one first capacitor includes a first electrode arranged in the isolation region electrically isolated from the first sidewall by a first deep trench isolation barrier and a second electrode arranged in the isolation region electrically isolated from the second sidewall by a second deep trench isolation barrier and capacitively coupled to the first electrode, wherein the first electrode and the second electrode are laterally separated by a third deep trench isolation barrier.

BRIEF DESCRIPTION OF THE DRAWINGS

Embodiments are described herein making reference to the appended drawings.

DETAILED DESCRIPTION

Figure 1:
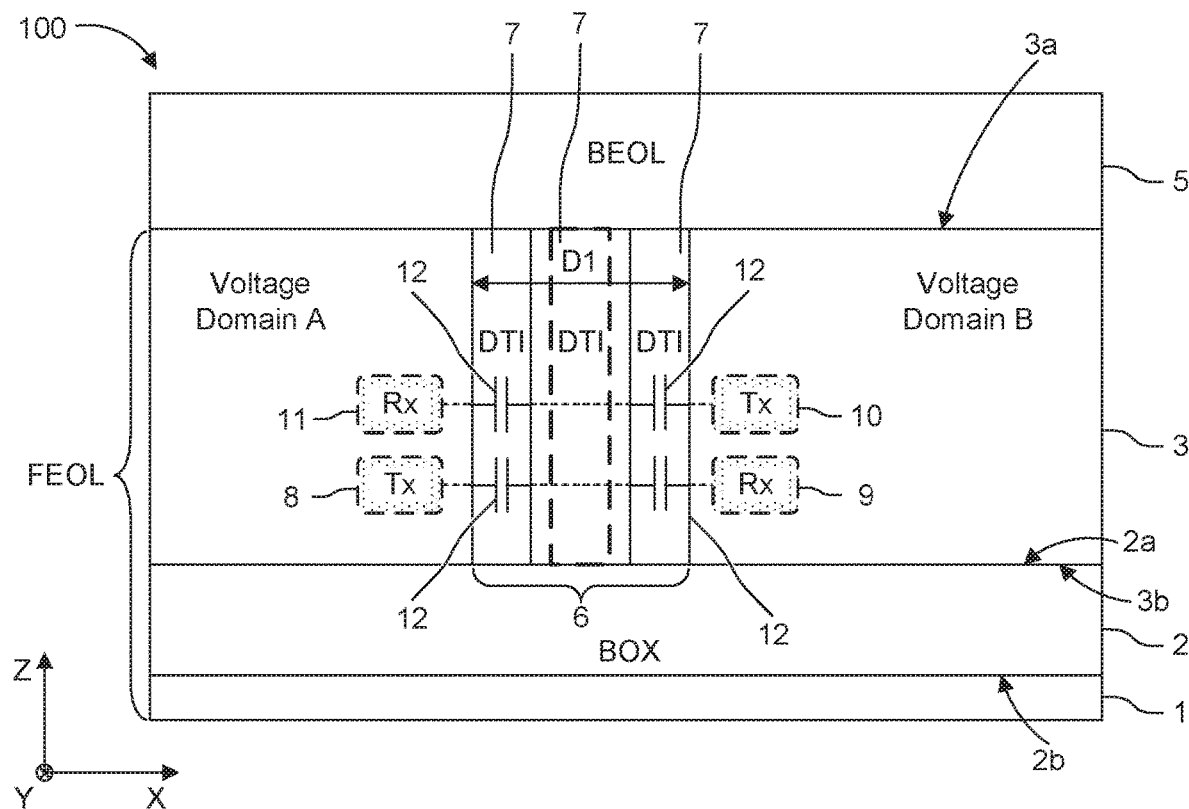
FIG. 1 illustrates a cross-sectional view of a multi-voltage domain device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate sufficiently to turn off the device. Current Io− is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches 0V. During a turn ON event, after some small amount of time (small compared to the PWM period), the gate current decreases and reaches a zero value when the gate reaches the high side supply level.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementarily to the each other for driving a phase load.

FIG. 1 illustrates a cross-sectional view of a multi-voltage domain device 100 according to one or more embodiments. The multi-voltage domain device 100 may be a monolithic device, such as a semiconductor chip with multiple voltage domains integrated therein. The multi-voltage domain device 100 includes one or more vertical capacitor couplers (i.e., capacitors) whose electric field is formed laterally (i.e., horizontally or parallel to the main chip surface of a semiconductor chip). In other words, the electrodes of the capacitors are vertical electrodes. Furthermore, the capacitors are formed laterally within a semiconductor layer of the semiconductor chip, underneath a BEOL layer stack.

The multi-voltage domain device 100 includes a stack of semiconductor layers, isolation layers, and metal layers. In particular, the multi-voltage domain device 100 formed from a silicon on insulator (SOI) wafer a semiconductor substrate 1 and a semiconductor layer 3 arranged at opposite sides of a buried oxide (BOX) layer 2. Thus, the BOX layer 2 may be formed in a SOI wafer may alternatively be referred to as a wafer insulator layer. It is noted that other types of semiconductor substrate/insulator layer structures could also be used.

The semiconductor layer 3 may be a silicon layer in which functional circuit components and devices are formed and is formed on the BOX layer 2. The semiconductor substrate 1, the BOX layer 2, and the semiconductor layer 3 make up the front-end-of-line (FEOL) portion of the multi-voltage domain device 100 (i.e., of the semiconductor chip). Thus, the upper main surface 3a (top side) of the semiconductor layer 3 makes up the upper main surface of the FEOL portion on which a back end of line (BEOL) layer stack 5 is disposed in contact therewith. The semiconductor layer 3 also includes a lower main surface 3b (bottom side). The BEOL layer stack 5 may include a first metal layer (metal layer 1) disposed in contact with upper main surface 3a, and additional insulating layers and metal layers disposed on the first metal layer. Thus, metal layers (e.g., M1, M2, M3, etc.) and insulating layers, such as oxide layers, are stacked in the vertical direction to form the BEOL layer stack 5.

The multi-voltage domain device 100 includes a first voltage domain (e.g., voltage domain A) that is laterally isolated from a second voltage domain (e.g., voltage domain B) by an isolation region 6. The isolation region includes one or more deep trench isolation (DTI) barriers 7. Each of the DTI barriers 7 extends vertically from the main surface 3a of the semiconductor layer 3 to the BOX layer 2 that is arranged at the lower main surface 3b of the semiconductor layer 3. As indicated by the dotted outline, the middle DTI barrier 7 may be optional.

DTI is a method to electrically isolate two or more regions of silicon within a chip. When used in conjunction with a standard wafer, it is a junction isolation technique. When it is used in conjunction with an SOI approach (e.g., either with an SOI wafer or post SOI or any other method) it results in a galvanic isolation.

For example, voltage domain A may be a low-voltage (LV) domain or a mid-voltage (MV) domain and voltage domain B may be a high-voltage (HV) domain. A LV domain is a region that includes low-voltage devices, a MV domain is a region that includes mid-voltage devices, and a HV domain is a region that includes high-voltage devices. For example, low-voltage devices may be supplied with 0-5V, mid-voltage devices may be supplied with 0-30V, and high-voltage devices may be supplied with over 100 volts (e.g., 120V-160V). The voltage domains are not limited to these voltage ranges, but are instead intended to provide an example of one implementation. Nevertheless, general principle of different voltage domain levels at different voltage hierarchies remains intact. Thus, a greater level of isolation may be needed when the voltage domain A is an LV domain than when compared to when the voltage domain A is an MV domain because the voltage difference between LV and HV domains is greater than a difference between MV and HV domains. Two different voltage domains of an integrated circuit may be laterally separated (isolated) from each other in the x-direction by the isolation region 6.

Each DTI barrier 7 includes at least one fill material, one of which is a dielectric fill. For example, the trench of each DTI barrier 7 may be filled entirely with a dielectric material, such as an oxide. Alternatively, the trench of each DTI barrier 7 may be filled by a combination of dielectric material, such as an oxide, and a conductive material, such as polysilicon or metal. Alternatively, the trench of each DTI barrier 7 may include a combination of dielectric fill and no fill (air) regions.

Figures 2A, 2B, 2C:
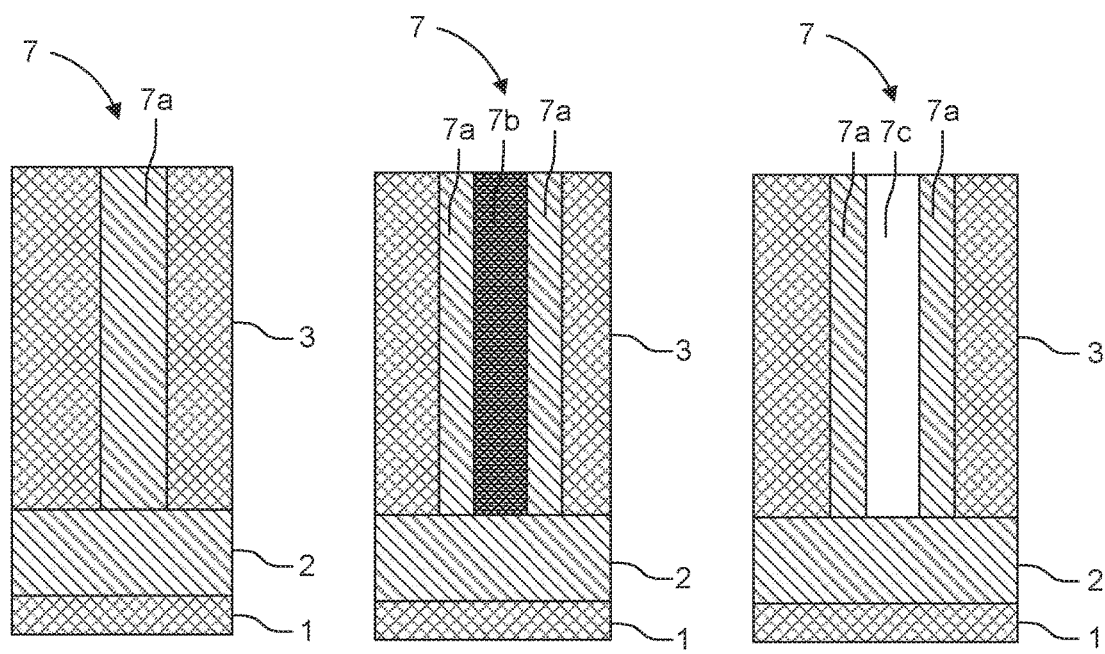
FIGS. 2A-2C shows cross-sectional views of a DTI barrier 7 with different fill materials according to one or more embodiments.

FIGS. 2A-2C shows cross-sectional views of a DTI barrier 7 with different fill materials according to one or more embodiments. In particular, the DTI barrier 7 shown in FIG. 2A includes a dielectric fill 7a. The DTI barrier 7 shown in FIG. 2B includes a conductive fill 7b that is laterally interposed between two dielectric fills 7a that are disposed at and along the sidewalls of the trench. The DTI barrier 7 shown in FIG. 2C includes a dielectric fills 7a disposed at the sidewalls of the trench, with a trench cavity 7c with no fill therebetween.

The lateral dimension D1 of the isolation region 6 is defined by the maximum distance between two laterally opposed sidewalls of the DTI barriers 7. The number of DTI barriers 7 and the lateral dimension D1 can be adjusted based on the desired level of isolation required to isolate the first voltage domain (e.g., voltage domain A) from the second voltage domain (e.g., voltage domain B). As will be discussed in detail below, capacitors are formed in the isolation region 6 for capacitive signal transmissions between voltage domains. As a result, the BEOL process need not be changed in order to accommodate different levels of isolation. In addition, thick dielectric layers in the BEOL layer stack 5 for voltage domain isolation is not required.

The semiconductor layer 3 includes communication circuitry including a transmitter 8 arranged in voltage domain A that is capacitively coupled to a receiver 9 arranged in voltage domain B, and a transmitter 10 arranged in voltage domain B that is capacitively coupled to a receiver 11 arranged in voltage domain A. This configuration allows bidirectional communication via capacitive signal transmissions between the two voltage domains. Alternatively, it will be appreciated that the communication circuitry may include only one receiver/transmitter pair for unidirectional communication, or more than two receiver/transmitter pair for additional communication capabilities.

Arranged within the isolation region 6, and specifically across one or more DTI barriers 7 are capacitors 12 that are used for the capacitive signal transmissions. The capacitors 12 couple their respective receiver/transmitter pairs together via capacitive coupling and enable communication between two voltage domains. It will be appreciated that one or more capacitors may be connected in series to between each receiver/transmitter pair, dependent on the level of isolation required and the lateral dimension D1 used. Thus, the described embodiments make use of the thick SOI film and move the coupling capacitance into a lateral trench of the isolation region 6. The electric field generated by a capacitor extends or is transmitted laterally across at least a portion of the isolation region 6. This reduces the area requirements significantly and uses the dielectric of the highly isolating trenches instead of requiring thick dielectric layers in the BEOL processes.

Figure 3:
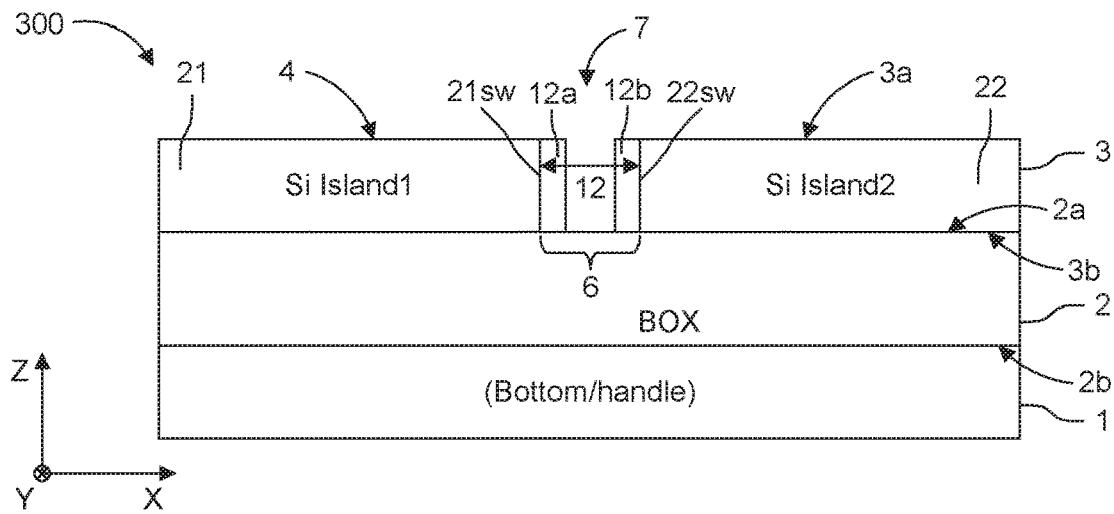
FIG. 3 is a cross-sectional view of a front end of line (FEOL) structure of a multi-voltage domain device according to one or more embodiments.

FIG. 3 is a cross-sectional view of a FEOL structure 300 of a multi-voltage domain device according to one or more embodiments. The FEOL structure 300 includes the semiconductor substrate 1, the BOX layer 2, and the semiconductor layer 3, and may be formed by a SOI process. The FEOL structure 300 includes two different voltage domains that are separated from each other by placing them on separate silicon islands 21 and 22, respectively. These silicon islands are insulated from each other by the BOX layer 2, which is typically a thick bottom oxide, and by a lateral insulation element. In particular, the thickness of the BOX layer 2 between its upper main surface 2a and its lower main surface 2b may be 100 nm for performance logic up to 10 to 15 μm for post SOI or even up to 20 μm in certain applications (i.e., a thickness range of 100 nm-20 μm, depending on the application).

In this case, the lateral insulation element is a DTI barrier 7 that includes a trench that extends vertically from the upper main surface 3a to the BOX layer 2. As noted above, the trench may be filled with an oxide, any other insulating material, or a combination of insulating and non-insulating materials. Additionally, or alternatively, the trench, or a portion thereof, may be left empty and unfilled.

A capacitor 12, including vertical electrodes 12a and 12b, is used for capacitive signal transmission across the isolation region 6 (i.e., across the DTI barrier 7) in the lateral direction that is parallel to the upper main surface 3a. The sidewalls 21sw and 22sw or edge regions of the silicon islands 21 and 22 that are laterally facing each other may be used to form the capacitor 12. In other words, the sidewall 21sw of silicon island 21 adjacent to the DTI barrier 7 may be oppositely doped (i.e., counter-doped) with respect the body of the silicon island 21 to form electrode 12a. For example, the body of the silicon island 21 may be n doped and the sidewall 21sw may be p doped to form the electrode 12a. Similarly, the sidewall 22sw of silicon island 22 adjacent to the DTI barrier 7 may be oppositely doped with respect the body of the silicon island 22 to form electrode 12b. For example, the body of the silicon island 22 may be n doped and the sidewall 22sw may be p doped to form the electrode 12a. Thus, the adjacent trench sidewalls 21sw and 22sw form a capacitor 12 with the sidewalls 21sw and 22sw as the electrodes and the DTI barrier 7 as the dielectric of the capacitor 12. The DTI barrier 7 may include one or more trench fill materials (oxide, high-k dielectric, nothing, multilayer structures including conductive materials or even percolative fills), as shown in FIGS. 2A-2C, that form the dielectric of the capacitor 12. Multilayer DTI barrier structures may include laterally alternating dielectric (insulating) and conductive materials, as shown in FIG. 2B.

To improve the native capacity of the sidewall, the sidewalls 21sw and 22sw can be (highly) doped by (angled) implantation, plasma assisted doping, doping from gas phase or doping from out-diffusion of coated layers (e.g., boron or phosphorous spin on glasses), which may or may not be removed afterwards.

Additionally, or alternatively, to form the electrodes 12a and 12b, the sidewalls 21sw and 22sw may be coated with a conductive layer (e.g., via chemical vapor deposition (CVD), atomic layer deposition (ALD), silicide deposition, electrical deposition, or electroless deposition), such as any metal such as aluminum or copper with their respective barrier, adhesion, seed, or growth layers or any other conductive material like titanium nitride (TiN) or a conductive oxide. Such a conductive coating or conductive plate can be used instead of counter-doping the sidewalls 21sw and 22sw of the respective silicon islands 21 and 22. Thus, it can be said that the vertical electrodes 12a and 12b are formed at the sidewalls 21sw and 22sw, whether they be formed "in" the sidewalls by counter-doping or formed "on" the sidewalls by depositing a conductive material thereto. As a result, two metallized or highly doped conductive sidewalls laterally facing each other across the trench of the DTI barrier 7 form a capacitor 12, which is to be contacted by on-die circuitry to achieve a signal (or power) transmission link between two voltage domains on separated silicon islands 21 and 22.

Figure 4:
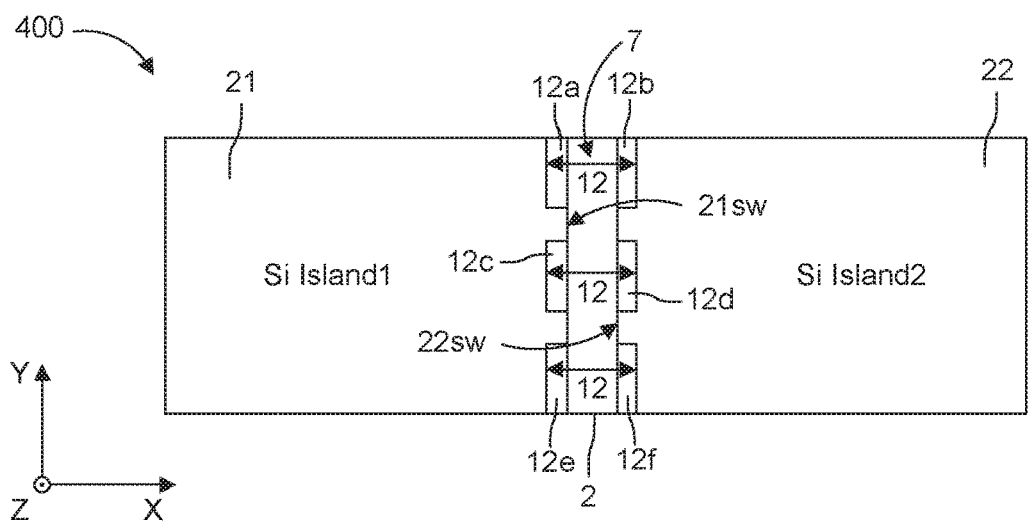
FIG. 4 is a cross-sectional view of another FEOL structure of a multi-voltage domain device according to one or more embodiments.

FIG. 4 is a top view of a FEOL structure 400 of a multi-voltage domain device according to one or more embodiments. The FEOL structure 400 includes the semiconductor substrate 1 (not illustrated), the BOX layer 2, and the semiconductor layer 3, and may be formed by a SOI process. The FEOL structure 300 includes two different voltage domains that are separated from each other by placing them on separate silicon islands 21 and 22, respectively.

As before, the silicon islands 21 and 22 are formed from the semiconductor layer 3. Also, as before, these silicon islands are insulated from each other by the BOX layer 2, which is typically a thick bottom oxide with the previously described dimension, and by a lateral insulation element. In this case, the lateral insulation element is a DTI barrier 7 that includes a trench that extends vertically from the upper main surface 3a to the BOX layer 2. As noted above, the trench of the DTI barrier 7 may be filled with an oxide, any other insulating material, or a combination of insulating and non-insulating materials. Additionally, or alternatively, the trench, or a portion thereof, may be left empty and unfilled.

The FEOL structure 400 uses a principle of multichannel capacitive sidewall couplings between two insulated silicon islands. Different highly conductive regions face their counterparts on the laterally separate silicon islands. In this case, three capacitive channels between adjacent islands can be realized by three individual capacitors 12 that are arranged along the trench of the DTI barrier 7 (e.g., in the y-direction). The capacitors 12 are each formed by a respective vertical electrode pair (e.g., 12a/12b, 12c/12d, or 12e/12f) that are laterally separated across the DTI barrier 7. The electrodes 12a-12f can be formed by structuring highly conductive regions at the sidewall 21sw and 22sw into laterally facing electrode pairs via either doping the sidewalls 21sw and 22sw of the silicon islands 21 and 22 and/or coating the sidewalls 21sw and 22sw with conductive material. Structuring can be achieved by different integration schemes involving photolithography.

As a result, three transmission channels are formed between the two silicon islands 21 and 22 that span across the DTI barrier 7. Each electrode pair 12a/12b, 12c/12d, and 12e/12f forms a capacitive channel between the silicon islands 21 and 22, whereas two or more channels can be combined to improve transmission quality in a transmission direction (e.g., two channels for differential transmission or phase-based transmission). For example, one of the transmission channels can be used to transmit information in one transmission direction between the silicon islands 21 and 22 and two of the transmission channels can be used to transmit information in the opposite transmission direction between the silicon islands 21 and 22 via a differential transmission or via a phase-based transmission where the receiver measures the phases of the two capacitive signal transmissions, determines a phase difference therebetween, and decodes the transmitted information based on the determined phase difference.

It is also possible to size the electrodes of each of the capacitors 12 according to information priority. For example, a large/wide capacitor may be used for transmitting real time control signals and a smaller capacitor may be used for transmitting data signals (e.g., feedback information). For instance, a feedback data signal received from a first voltage domain (e.g., a high voltage domain of a gate driver) via a smaller capacitor may allow for error correction to be performed by a control circuit located in a second voltage domain (e.g., a low voltage domain of the gate driver). The control signal can then be transmitted back to the first voltage domain by the control circuit using the larger capacitor.

Figure 5:
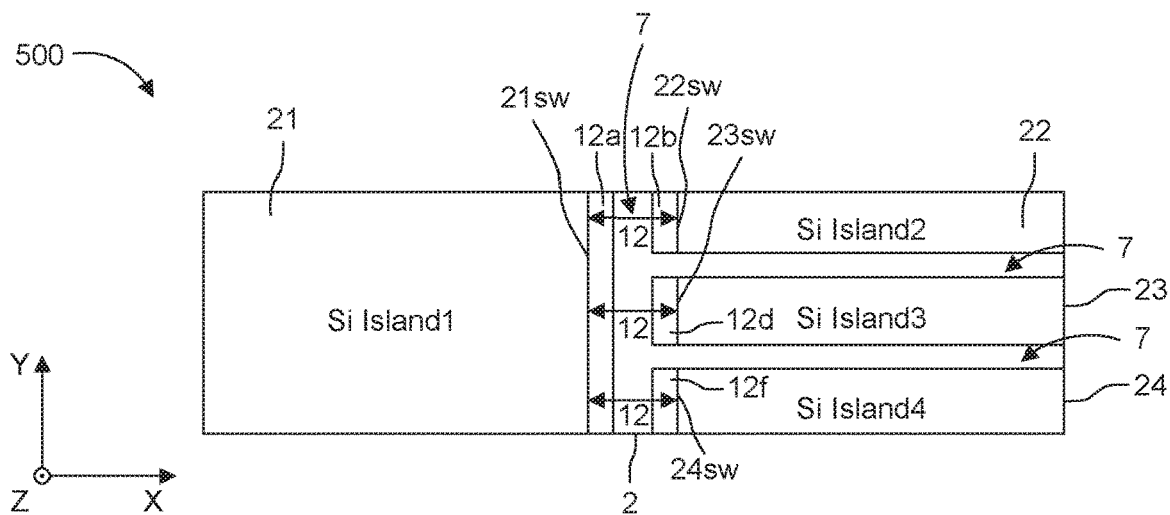
FIG. 5 is a cross-sectional view of another FEOL structure of a multi-voltage domain device according to one or more embodiments.

FIG. 5 is a top view of a FEOL structure 500 of a multi-voltage domain device according to one or more embodiments. The FEOL structure 500 includes the semiconductor substrate 1 (not illustrated), the BOX layer 2, and the semiconductor layer 3, and may be formed by a SOI process. The FEOL structure 300 includes four different voltage domains that are separated from each other by placing them on separate silicon islands 21-24, respectively.

Each of the silicon islands 21-24 are laterally separated from each other (i.e., in the x- and/or y-direction) by a DTI barrier 7 that may be formed by a contiguous trench. Each silicon islands 21-24 includes a sidewall 21sw, 22sw, 23sw, or 24sw or edge region at which an electrode 12a, 12b, 12d, or 12f is provided, respectively. In this case, the electrode 12a of silicon island 21 laterally faces and is shared with electrodes 12b, 12d, and 12f of the other silicon islands 22-24. As a result, multichannel capacitive sidewall coupling is formed between several insulated silicon islands with a larger, shared electrode 12a on the one end of the capacitive channel and several receiving electrodes 12b, 12d, and 12f at respective ends of the multiple channels. Thus, the transmission circuitry in silicon island 21 can simultaneously transmit information to separate receiver circuitries located in the other silicon islands 22-24 over three capacitive channels formed by separate capacitors 12.

Thus, it is possible to generate multichannel unidirectional communication from the large voltage domain (i.e., a primary island) to several smaller, secondary receiving voltage domains/islands. Of course, the receiving islands can be located on any (and different) sides of the primary island. The same principle can be realized with a structured conductive bottom electrode, extending below the BOX layer 2 under the insulated silicon islands, creating an extended electrode to which several islands can be coupled to by their respective capacitor electrode. Of course, there can be more than one electrode at the underside of each silicon island and more than one bottom electrode below the BOX layer 2 in contact with each voltage.

Figure 6:
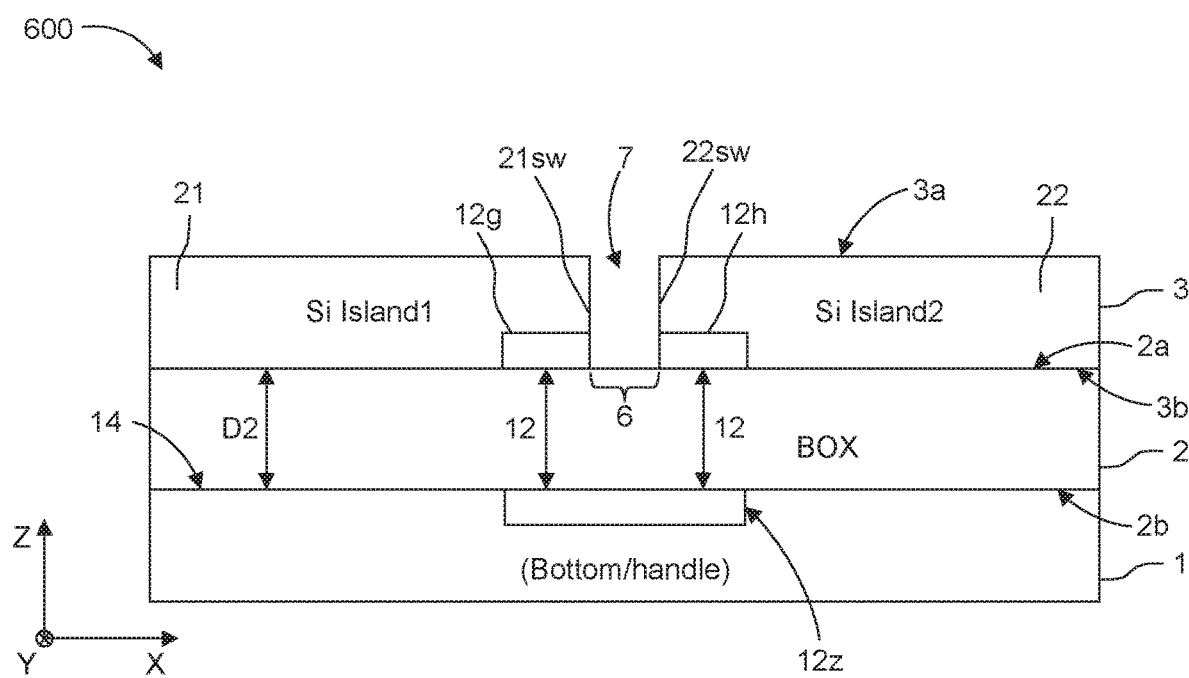
FIG. 6 is a cross-sectional view of another FEOL structure of a multi-voltage domain device according to one or more embodiments.

FIG. 6 illustrates a cross-sectional view of a FEOL structure 600 of a multi-voltage domain device according to one or more embodiments. The FEOL structure 600 includes the semiconductor substrate 1, the BOX layer 2, and the semiconductor layer 3, and may be formed by a SOI process. Additionally, two silicon islands 21 and 22 are provided at different voltage domains and are laterally separated by an isolation region 6 that includes a DTI barrier 7.

Doped, metalized, or otherwise highly conductive regions or structures can be created by the aforementioned semiconductor integration schemes on the bottom side 3b of the semiconductor layer 3 at an edge region adjacent to the sidewalls 21sw and 22sw of the two silicon islands 21 and 22, thereby forming electrodes 12e and 12f. Additionally, a doped, metalized, or otherwise highly conductive region or structure can be created by the aforementioned semiconductor integration schemes on a top side 14 of the semiconductor substrate 1 (i.e., a bottom wafer/handle wafer) below the BOX layer 2, thereby forming a bottom electrode 12z that vertically overlaps with the electrodes 12a and 12b in the vertical direction (i.e., the z-direction).

The conductive areas can be structured such that a down facing conductive area 12g integrated at the bottom side 3b of the semiconductor layer 3 faces a larger conductive area 12z integrated at the top side 14 of the on the semiconductor substrate 1 (i.e., the bottom wafer), which extends under the neighboring silicon island and is faced there by another down facing conductive area 12h to form two capacitors in a series connection.

The bottom electrode 12z is upward facing and is vertically separated from the electrodes 12g and 12h by the thickness D2 of the BOX layer 2. The electrodes 12g and 12h are capacitively coupled to the bottom electrode 12z with the BOX layer 2 used as the dielectric for the two series capacitors. In this case, the electrodes 12g, 12h, and 12z may be regarded as planar electrodes with vertical electric fields formed between electrodes 12g and 12z and 12z and 12h. A capacitive coupling between one pair of electrodes (e.g., electrodes 12g and 12z forming a first capacitor) induces a corresponding capacitive coupling between the second pair of electrodes (e.g., 12z and 12h forming a second capacitor), with the bottom electrode 12z being shared between the two electrode pairs. Thus, a capacitive signal can be transmitted from a transmitter in one voltage domain to a receiver in the other voltage domain via the two capacitors 12 that are connected in series.

In any case, a combination of sidewall coupling and bottom coupling is possible in any geometry and multitude. It is in principle also possible to divide a sidewall electrode not only laterally, as shown in FIG. 4, but also in the thickness direction (i.e., the z-direction) by creating an upper and a lower capacitively coupled signal path or any multitude or combination. For example, is possible to cut two facing electrodes (e.g., electrodes 12a and 12b, electrodes 12c and 12d, electrodes 12e and 12f, or electrodes 12i and 12j in FIGS. 7-10) in half and use the respective upper and lower halves as separate capacitors for separate channels or differential signaling. The bottom (vertical) coupling may also be used in similar arrangements shown in FIGS. 4 and 5. For example, one or more bottom electrodes 12z may be disposed underneath the BOX layer 2, and electrodes 12a-12f can be formed as planar electrodes at the bottom side 3b of semiconductor layer 3 in the manner described in reference to electrodes 12g and 12h shown in FIG. 6. Thus, each capacitor 12 shown in FIGS. 4 and 5 can be replaced by two series capacitors that are connected in series by a respective bottom electrode that is integrated at the top side 14 of the semiconductor substrate 1.

Another beneficial embodiment involves the use of adjusted geometrical layout, for example, by adjusting the shape of the two coupled voltage domains in a way that improves their coupling, like creating interdigitated structures with a meandering electrode and isolation trench, or partially or fully surrounding one domain by the other with an isolation trench (i.e., a DTI barrier 7) therebetween. When using interdigitated structures, two coupled voltage domains may interlock via alternating structures with an isolation trench therebetween. Thus, the isolation trench may have a meandering pattern between the interdigitated structures. The electrode in this case may meander along the isolation trench or may have electrode pairs that are placed at different locations long the isolation trench. An electrode pair could face in different lateral directions with respect to another electrode pair depending on their placement along the meandering isolation trench.

Figure 7:
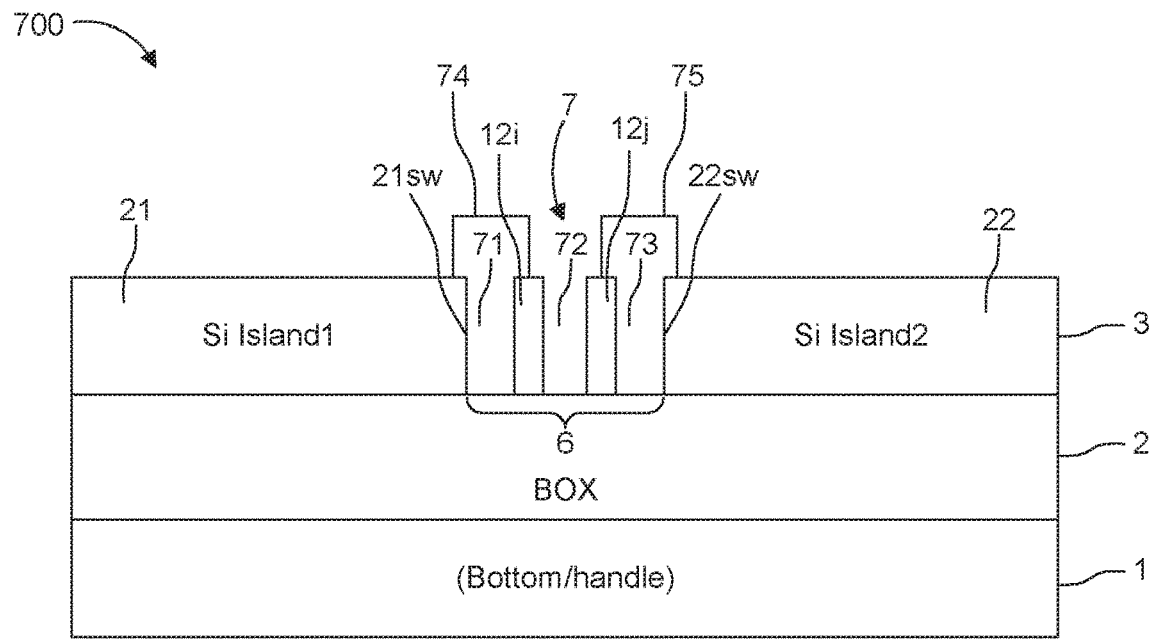
FIG. 7 is a cross-sectional view of another FEOL structure of a multi-voltage domain device according to one or more embodiments.

FIG. 7 illustrates a cross-sectional view of a FEOL structure 700 of a multi-voltage domain device according to one or more embodiments. The FEOL structure 700 includes the semiconductor substrate 1, the BOX layer 2, and the semiconductor layer 3, and may be formed by a SOI process. Additionally, two silicon islands 21 and 22 are provided at different voltage domains and are laterally separated by an isolation region 6 that includes a DTI barrier 7.

The isolation region 6 includes two vertical electrodes 12i and 12j that form a capacitor 12 for lateral capacitive transmission signaling. The electrodes 12i and 12j extend vertically into the trench of the DTI barrier 7 down to the BOX layer 2. The electrodes 12i and 12j are conductive structures that may be formed by any of the above-described semiconductor integration schemes, including counter-doping the semiconductor layer 3 or forming the electrodes 12i and 12j as metal structures, and forming a trench 71 laterally between silicon island 21 and electrode 12i, forming a trench 72 laterally between electrodes 12i and 12j, and forming a trench 73 laterally between silicon island 22 and electrode 12j. Each of the electrodes 12i and 12j may also be formed by dielectric lamella with conductive and contacted sidewalls. The trenches 71-73 may be filled with any of the aforementioned dielectric materials/structures (e.g., as shown in FIGS. 2A-2C) or left unfilled. Thus, the electrodes 12*i* and 12*j* are insulated from the each other, as well as from the sidewalls 21*sw* and 22*sw* of the silicon islands 21 and 22, via the trenches 71-73 and the BOX layer 2. Thus, the electrodes 12*i* and 12*j* are trench-insulated conductive structures.

Furthermore, the electrodes 12*i* and 12*j* are electrically connected to one of the silicon islands 21 or 22. In particular, electrode 12*i* is electrically connected to communication circuitry (e.g., a transmitter or a receiver) integrated in the silicon island 21 via an electrical connection 74. The electrical connection 74 may be formed by metal layers and vias formed in the BEOL layer stack 5 (not illustrated). Similarly, electrode 12*j* is electrically connected to communication circuitry (e.g., a receiver or a transmitter) integrated in the silicon island 22 via an electrical connection 75. Th electrical connection 75 may be formed by metal layers and vias formed in the BEOL layer stack 5 (not illustrated). Thus, one electrode is electrically contacted to a transmitting voltage domain and the other electrode is electrically contacted to a receiving voltage domain.

Figure 8:
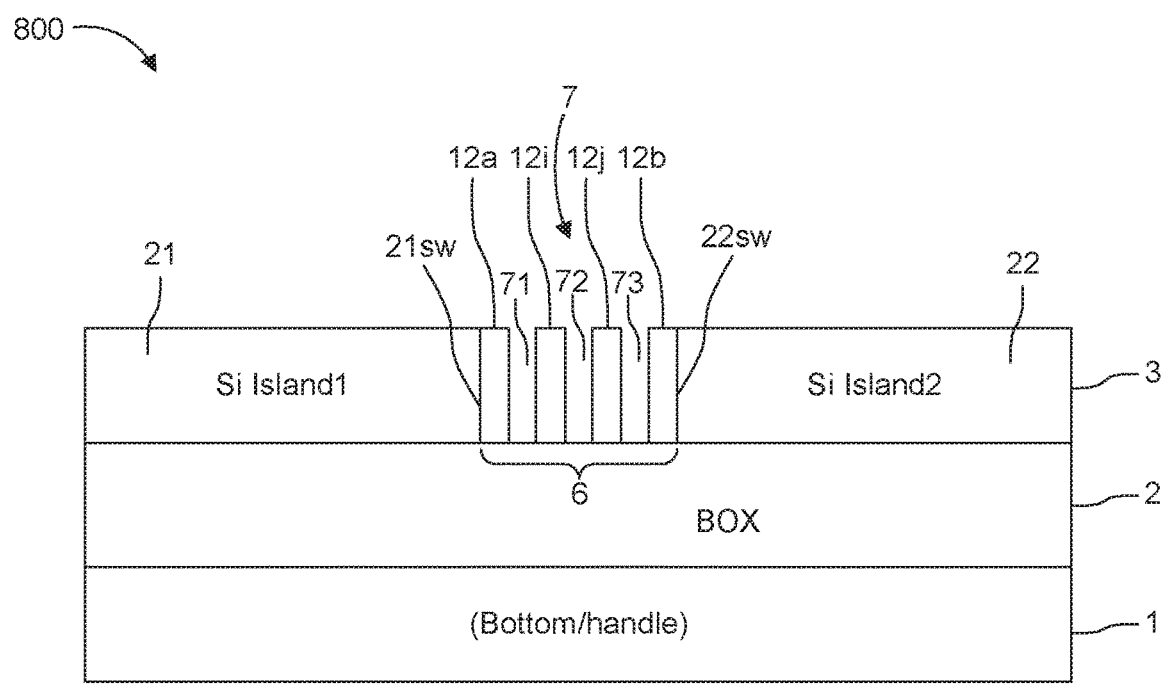
FIG. 8 is a cross-sectional view of another FEOL structure of a multi-voltage domain device according to one or more embodiments.

FIG. 8 illustrates a cross-sectional view of a FEOL structure 800 of a multi-voltage domain device according to one or more embodiments. The FEOL structure 800 includes the semiconductor substrate 1, the BOX layer 2, and the semiconductor layer 3, and may be formed by a SOI process. Additionally, two silicon islands 21 and 22 are provided at different voltage domains and are laterally separated by an isolation region 6 that includes a DTI barrier 7.

Electrodes 12*a* and 12*b* are formed at the lateral sidewalls 21*sw* and 22*sw* of their respective silicon islands 21 and 22, facing each other across the DTI barrier 7. Additionally, electrodes 12*i* and 12*j* are provided between electrodes 12*a* and 12*b*, where each electrode 12*a*, 12*b*, 12*i*, and 12*j* is insulated from its neighboring electrode(s) via trenches 71, 72, and 73, respectively. Together, the electrodes 12*a*, 12*b*, 12*i*, and 12*j* form a chained capacitive coupler. The trenches 71-73 may be filled with any of the aforementioned dielectric materials/structures (e.g., as shown in FIGS. 2A-2C) or left unfilled.

As a result, chained capacitive sidewall coupling is realized between two insulated silicon islands 21 and 22. This configuration allows a scaling of the chained capacitive coupler to the required voltage insulation level, with additional electrodes being added to increase the width D1 of the isolation region and thus increase the level of isolation between the two silicon islands 21 and 22. Of course, it is also possible to remove one or both middle electrodes 12*i* and 12*j* to decrease the width D1 of the isolation region 6. In this embodiment, the middle electrodes 12*i* and 12*j* are floating electrodes and electrical connections 74 and 75 are not present. Thus, capacitive signals are transmitted via the daisy-chained capacitive coupling between subsequent pairs of electrodes. This allows achieving a higher insulation class (breakdown voltage) at the cost of lower coupling capacity.

As a result of using the sidewalls of two adjacent SOI voltage domains (islands) insulated by trenches in the aforedescribed embodiments, area and cost efficient electrical coupling is realized. This electrical coupling can be used for creating and transmitting electrical signals or transferring power via one or more channels between two electrically insulated voltage domains. Any of the aforementioned capacitors 12 can also be used in an energy transfer circuit that is used to transfer energy or power between two voltage domains in a DC-DC converter application.

Figure 9:
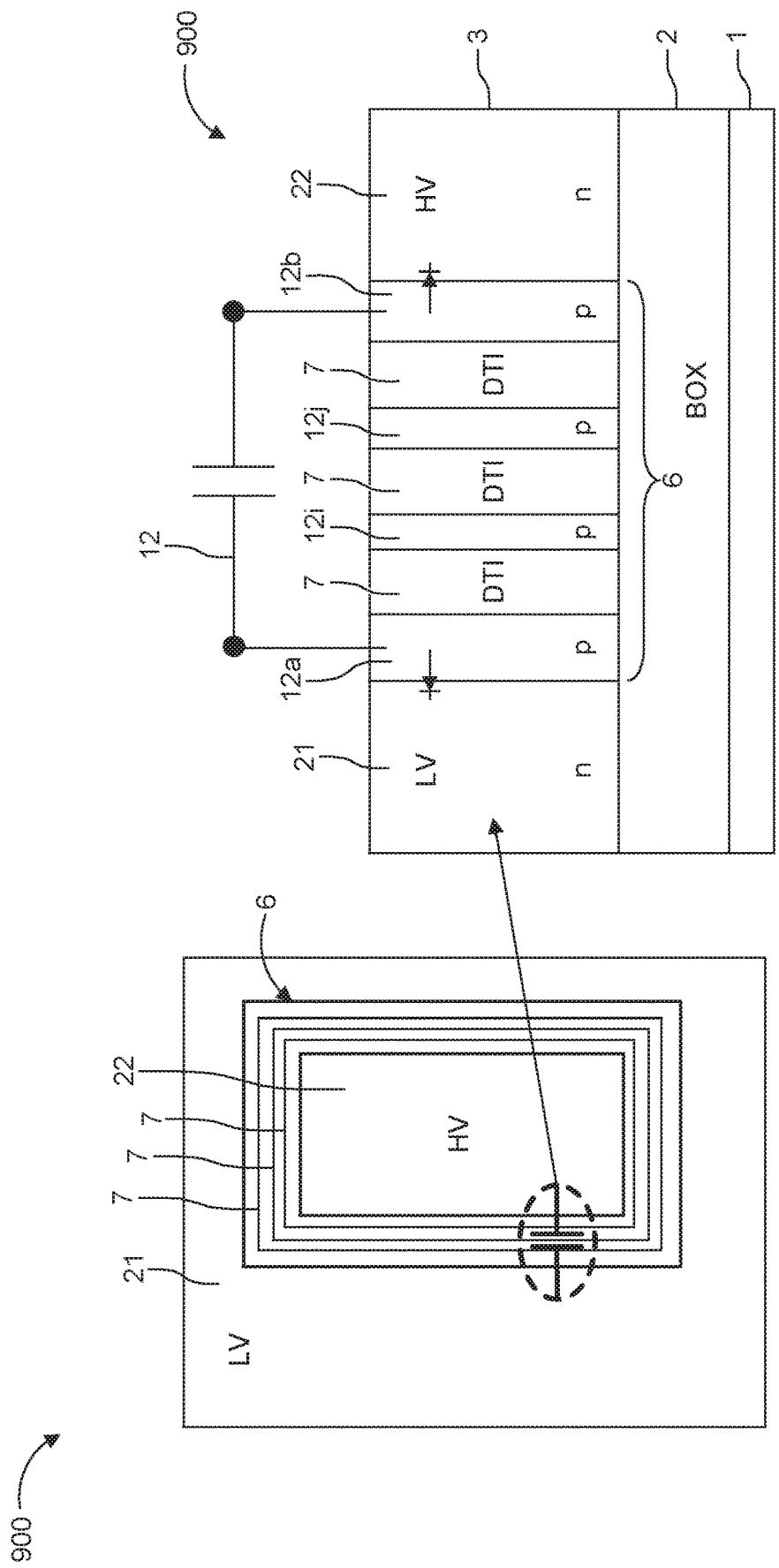
FIG. 9 illustrates a top view (left) and a cross-sectional view (right) of a FEOL structure of a multi-voltage domain device according to one or more embodiments.

FIG. 9 illustrates a top view (left) and a cross-sectional view (right) of a FEOL structure 900 of a multi-voltage domain device according to one or more embodiments. The FEOL structure 900 may be similar to FEOL structure 800 depicted in FIG. 8 and includes the semiconductor substrate 1, the BOX layer 2, and the semiconductor layer 3, and may be formed by a SOI process.

Additionally, two silicon islands 21 and 22 are provided at different voltage domains and are laterally separated by an isolation region 6 that includes DTI barriers 7. In particular, silicon island 21 is a low-voltage (LV) domain and silicon island 22 is a high-voltage (HV) domain 22 that is encircled by silicon island 21 and the isolation region 6. In particular, the isolation region 6 includes concentric DTI barriers 7 (e.g., dielectric filled trenches) that encircle the silicon island 22. The number of concentric DTI barriers 7 and, thus, the width of the isolation region 6 can be adapted according to the level of voltage isolation required by the isolation region.

A capacitor 12 is formed across the isolation region 6 for capacitive signal transmission or energy (power) transfer. To define the terminals (i.e., electrodes 12*a* and 12*b*) of the capacitor 12, highly p-doped silicon regions are formed at the laterally facing sidewalls of the silicon islands 21 and 22. The body of the silicon islands 21 and 22 remains n-doped as the doping type of the semiconductor layer 3. Of course, the silicon islands 21 and 22 may have other doped regions according to the integration of FEOL devices (e.g., transistor cells, diode cells, resistors, capacitors, etc.) that are patterned in the semiconductor layer 3. Additional p-doped regions form electrodes 12*i* and 12*j*. Doping for forming electrodes 12*a*, 12*b*, 12*i*, and 12*j* may be performed either pre or post DTI etch, using implant and furnace methods to establish a highly doped regions (for contact). It will also be appreciated that the n and p-dopings can be swapped.

As noted above, the terminals 12*a* and 12*b* of the capacitor 12 are highly doped p regions. The terminals in this instance are highly p-doped since the body of the silicon islands 21 and 22 are n-doped. Thus, in general terms the terminals 12*a* and 12*b* of FIG. 9 need to be doped inversely to the silicon islands. Accordingly, a p-n junction (i.e., a diode) is formed between the terminals 12*a* and 12*b* and their respective silicon islands 21 and 22.

Figure 10:
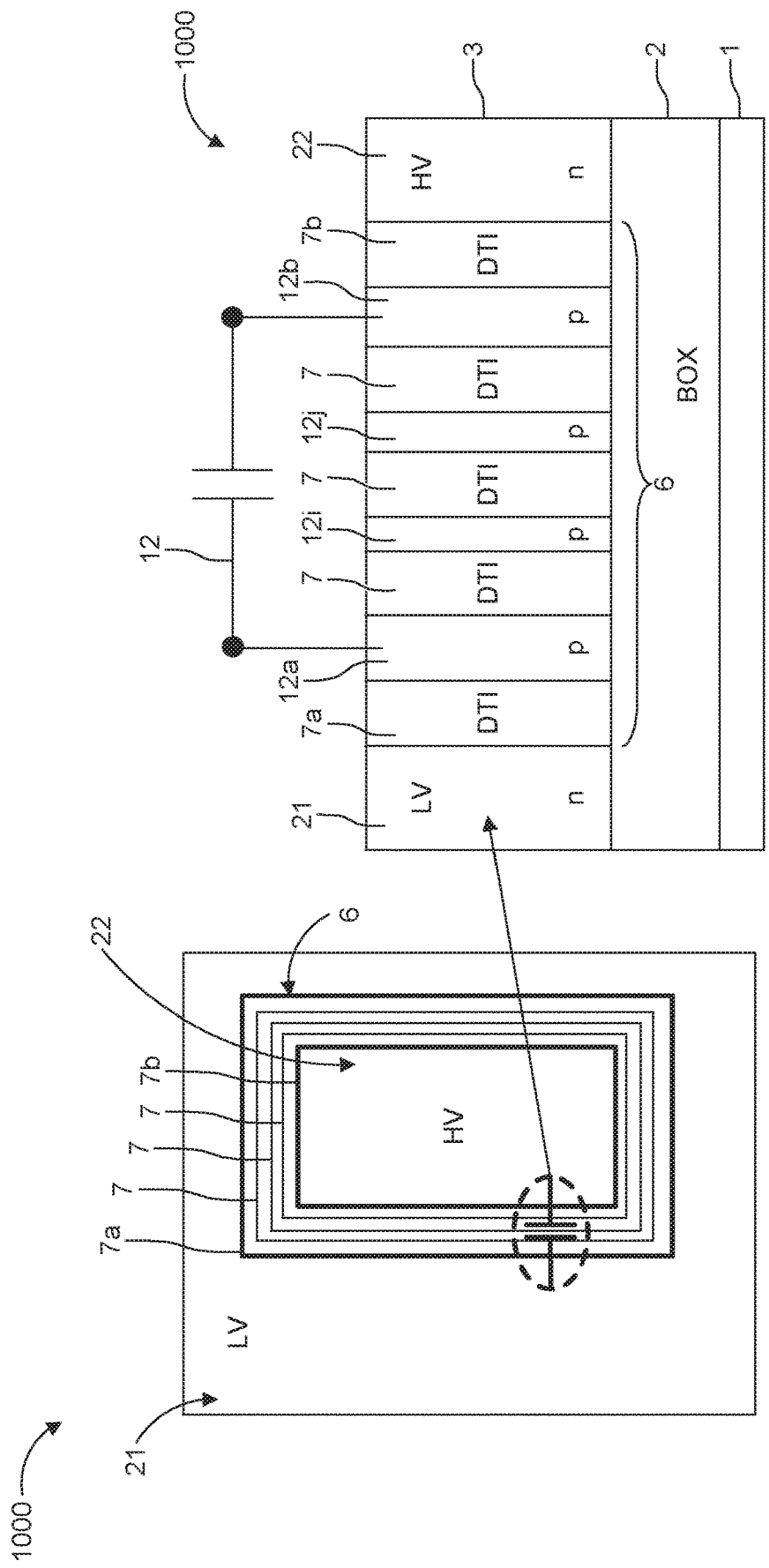
FIG. 10 illustrates a top view (left) and a cross-sectional view (right) of a FEOL structure of a multi-voltage domain device according to one or more embodiments.

FIG. 10 illustrates a top view (left) and a cross-sectional view (right) of a FEOL structure 1000 of a multi-voltage domain device according to one or more embodiments. The FEOL structure 1000 may be similar to FEOL structure 900 depicted in FIG. 9 and includes the semiconductor substrate 1, the BOX layer 2, and the semiconductor layer 3, and may be formed by a SOI process. However, in contrast to FEOL structure 900, the FEOL structure includes two additional DTI rings 7*a* and 7*b* disposed between the terminals 12*a*, 12*b* of the capacitor 12 and the silicon islands 21 and 22. The DTI rings 7*a* and 7*b* are used to galvanically isolate the capacitor terminals 12*a* and 12*b* from the silicon body of the islands 21 and 22 and thus from the silicon body potential. Due to this galvanic isolation, the terminals 12*a*, 12*b* need not be doped inversely to the body of the silicon islands 21 and 22. They only need to be highly doped and thus be can be formed as highly doped n+ or p+ regions, for example, having a higher doping concentration than a body of the silicon islands. In addition, the DTI rings 7*a* and 7*b* avoid the formation of p-n junctions between the capacitor terminals 12*a*, 12*b* and the respective silicon islands 21 and 22, which are present in FIG. 9.

Figure 11:
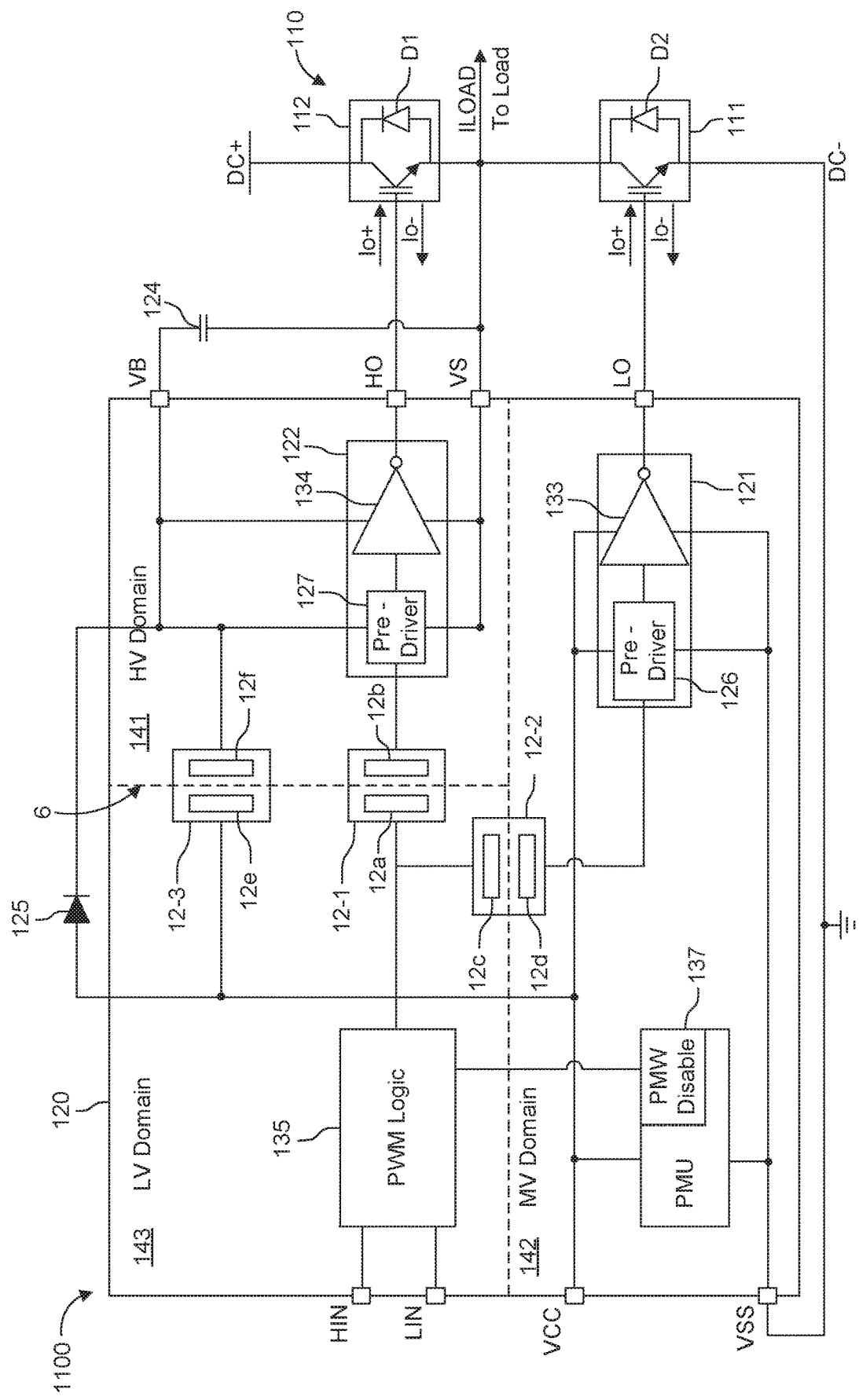
FIG. 11 is a schematic block diagram of a power module 1100 according to one or more embodiments.

FIG. 11 is a schematic block diagram of a power module 1100 according to one or more embodiments. The power module 1100 represents one example in which capacitors may be used to transmit electrical signals laterally across an isolation region within the FEOL portion of a device. The power module 1100 includes a single-phase drive stage 110 (i.e., an inverter leg) and a monolithic gate driver system 120 electrically coupled to the single-phase drive stage 110. However, the single-phase drive stage may be expanded to a multiple-phase drive state by adding additional inverter legs. Both the single-phase drive stage 110 and the gate driver system 120 are integrated into a single package (not illustrated). Thus, the power module 1100 is packaged as a single device.

The single-phase drive stage 110 includes a low-side transistor 111 and a high-side transistor 112 that are controlled for supplying a load current ILOAD to a one phase of a load (not illustrated). Freewheeling diodes D1 and D2 coupled to their respective power transistors 111 and 112 are also shown.

The gate driver system 120 is a high voltage (HV) gate driver system, that includes a low-side (LS) gate driver 121 used to drive the low-side transistor switch 111 and a high-side (HS) gate driver 122 used to drive the high-side transistor switch 112. The LS gate drive 121 and the HS gate driver 122 are located in different voltage domains of the gate driver system 120. Furthermore, the gate driver system 120 itself is a monolithic device with each region formed in a same semiconductor substrate (i.e., substrate layer 3).

Both gate drivers 121 and 122 perform gate driving of their respective power transistor 111 and 112 based on digital PWM signals LIN and HIN received from a microcontroller unit (MCU). The PWM signals are control signals received from the MCU at PWM logic 135 of the gate driver system 120. The PWM logic 135 receives the LIN and HIN signals from the MCU and ensures there is a minimum dead time implemented to prevent bridge shoot through. Eventually, the respective PWM control signals are passed on to the respective low-side and high-side gate driver 121 and 122, where the PWM signal HIN is sent to the high-side gate driver 122. After this point, the low-side and high-side gate driver 121 and 122 perform gate driving.

Both gate drivers 121 and 122 include separate pre-driver circuitry 126 and 127 and buffers 133 and 134, respectively. The pre-driver circuitries 126 and 127 are configured to receive the PWM signals and, based thereon, control the on/off state of a respective first current source, such as a source FET, used to generate current Io+. Additionally, the pre-driver circuitries 126 and 127 are configured to receive the PWM signals and, based thereon, control the on/off state of a respective second current source, such as a sink FET, used to generate current Io−. The respective current sources are provided in buffers 133 and 134. Thus, the buffers 133 and 134 may each include a pair of complementary FETs used to generate turn-on currents Io+ and turn-off currents Io− for their respective power transistor 111 and 112. Each of the pre-driver circuitries 126 and 127 may further command a respective buffer 133 or 134 to use a certain current capability.

The low-side gate driver 121 is arranged in a low-side region defined by a medium voltage domain or a low voltage domain, whereas the high-side gate driver is arranged in a high-side region defined by a high voltage domain. In practice, the gate driver system 120 also includes an isolation region 6 that isolates the different voltage domains from each other, and may be referred to as an isolation termination region. The isolation region 6 includes one or more DTI barriers 7 in accordance with the above-described embodiments. Thus, the isolation region 6 provides a voltage isolation barrier between two or more voltage domains.

The gate driver system 120 may be configured to receive PWM control signals, from an MCU, and turn on or turn off respective transistors 111 and 112 in accordance with the received PWM control signals. For example, during the turn-on process of a respective transistor 111 or 112, the gate driver system 120 may be used to provide (source) a gate current Io+ to the gate of the respective transistor 111/112 in order to charge the gate. In contrast, during the turn-off process, the gate driver system 20 may be used to draw (sink) a gate current Io− from the gate of the transistor 111/112 in order to discharge the gate.

Thus, the MCU is electrically coupled to the gate driver system 120 for the transmission of information signals and control signals HIN and LIN therebetween, and the gate driver system 120 is electrically coupled to the inverter leg 110 for driving the power transistors thereof.

Specifically, the MCU is configured to generate PWM control signals LIN and HIN for controlling the transistors 111 and 112, respectively, and transmit the control signals to the LV domain 143. For example, the gate driver system 120 is configured to receive instructions from the MCU to drive a load phase (i.e., an inverter leg) connected to voltage VS using the PWM control signals. These PWM control signals are received by the gate driver system 120 at the LV domain 143 (i.e., at input pins HIN and LIN) and passed through to the corresponding pre-driver circuitry 126 and 127 via the appropriate logic (e.g., the PWM logic 135). The buffers 133 and 134 are configured to receive the PWM control signals and drive the corresponding power transistor 111 and 112 via output terminals HO and LO of the gate driver system 120.

In this example illustrated in FIG. 11, four regions are present including: a high-side region defined by a HV domain 141, a low-side region defined by a medium-voltage domain (MV) domain 142 or mid-voltage domain, a low-voltage region defined by a LV domain 143, and an isolation region 6. Since the gate driver system 120 is a monolithic device, the four regions 6, 141, 142, and 143 are monolithically built into a single integrated circuit. In a monolithic solution, termination regions (i.e., isolation regions 6) within the die are used to isolate the different voltage domains. Here, capacitors 12-1 and 12-2 may be used to transmit capacitive transmission signals between different voltage domains via capacitive coupling. The capacitors 12-1 and 12-2 may be formed according to any of the aforementioned embodiments. It will also be appreciated that additional capacitors can be included between each neighboring voltage domain for multichannel and/or bidirectional communication. For example, the high-side gate driver 122 may receive control signals and possibly other communication signals from a circuitry located in the LV domain 143. Additionally, it may be desirable to transmit feedback information from the high-side gate driver 122 to a control circuit located in or coupled to the LV domain 143.

The LV domain 143 is a region that includes low-voltage devices, the MV domain 142 is a region that includes mid-voltage devices, and the HV domain 141 is a region that includes high-voltage devices. For example, low-voltage devices may be supplied with 0-5V, mid-voltage devices may be supplied with 0-30V, and high-voltage devices may be supplied with over 100 volts (e.g., 120V-160V). The voltage domains are not limited to these voltage ranges, but are instead intended to provide an example of one implementation. Nevertheless, general principle of different voltage domain levels at different voltage hierarchies remains intact.

The isolation region 6 is represented by the dotted line between the different voltage domains. The isolation region 6 isolates the different voltage domains from each other. Thus, the isolation region 6 provides a voltage isolation barrier between the different voltage domains. The isolation region 6 may be a unitary contiguous region or it may comprise two or more regions that are used to separate the various voltage domains.

The gate driver system 120 itself is a monolithic device with each region formed on a same semiconductor substrate (i.e., substrate 1).

Communication between voltage domains is enabled by capacitors 12-1 and 12-2, which have features equivalent to any of the capacitors 12 described herein. Communication circuitry (e.g., communication circuits 8, 9, 10, and 11) may be incorporated into the PWM logic 135 and pre-drivers 126 and 127 that are coupled to the capacitors 12-1 and 12-2. Each capacitor 12-1 and 12-2 includes at least one electrode pair (e.g., 12a/12b, 12c/12d, or 12e/12f). Bottom electrodes 12z may also be used as described above.

In one example, the LV domain 143 provides information from the PWM logic 135 to the gate drivers 121 and 122 located in the other voltage domains 141 and 142 via capacitors 12-1 and 12-2, respectively. As such, a capacitor 12-1 is configured to transmit electrical signals (e.g., PWM control signals) from the PWM logic 135 to the gate driver 122 (i.e., from a first voltage domain to a second voltage domain). Additionally, a capacitor 12-2 is configured to transmit electrical signals (e.g., PWM control signals) from the PWM logic 135 to the gate driver 121 (i.e., from the first voltage domain to a third voltage domain).

It will also be appreciated that respective components of the MV domain 142 and the LV domain 143 may be combined into the same voltage domain (e.g., an LV domain) such that they are integrated in a same region of the die. Thus, only capacitor 12-1 would be needed to transmit between the two existing voltage domains (e.g., the LV domain 143 and the HV domain 141).

While FIG. 11 shows an example comprising three isolated voltage domains, some embodiments may have a configuration in which there is no isolation between the MV domain 142 and the LV domain 143. In other words, the portion of the isolation region 6 between the MV domain 142 and the LV domain 143 shown in FIG. 11 may not be present. In this case, the isolation region 6 remains between the HV domain 141 and the other voltage domains 142 and 143 in order to isolate the HV domain 141 therefrom.

In addition, some embodiments may have a configuration in which the LV domain 143 is arranged entirely within the MV domain 142. In this case, the LV domain 143 may be a voltage island completely enclosed by isolation region 6 in order to isolate the LV domain 143 from the MV domain 142. Additionally, an isolation region 6 remains between the HV domain 141 and the MV voltage domain 142 in order to isolate the HV domain 141 from the MV domain 142. Accordingly, the LV domain 143 is isolated from the MV domain 142, and the HV domain 141 is isolated from the MV domain 142. It naturally follows that the LV domain 143 and the HV domain 141 are also isolated from each other by two separate isolation regions 5.

As described herein, VB refers to the high-side floating supply voltage; VS refers to the high-side floating ground voltage; VDD or VCC refers to the low-side and logic fixed supply voltage; VSS or VEE refers to a low-side ground voltage; HO refers to the high-side floating output voltage; LO refers to the low-side output voltage; DC+ refers to DC-link positive; DC− refers to DC-link negative; and HIN and LIN refers to the logic input voltages (i.e., control signals) received from the MCU.

In one example, the gate driver system 120 may be operated in a common mode of 130V with a floating supply having maximum operating range of 30V. In this example, VB operates at a maximum of 160V, VS operates at a maximum of 130V, VCC operates at 30V, and VSS operates at 0V. In particular, VS is equal to DC+ when transistor 112 is on (and transistor 111 is off) and equal to DC− when transistor 111 is on (and transistor 112 is off). In both cases, VB remains at substantially 30V above VS due to the bootstrap capacitor 124. A bootstrap diode 125, which may be external to the gate driver system 120 or integrated therein, may be used to charge the bootstrap capacitor 124 via an electrical coupling to VCC. The bootstrap diode 125 may have a low resistivity in order to rapidly charge the bootstrap capacitor 124. Thus, the low-side (external) supply voltage that supplies VCC may be set to 30V and the high-side supply voltage VB may be operated at a maximum voltage of 160V when DC+, equal to the common mode voltage, is 130V. DC− is tied to ground/VS S but does not have to be.

In another example, the gate driver system 120 may be operated in a common mode of 1500V with a floating supply having maximum operating range of 35V. In this example, VB operates at a maximum of 1535V, VS operates at a maximum of 1500V, VCC operates at 35V, and VSS operates at 0V. In particular, VS is equal to DC+ when transistor 112 is on (and transistor 111 is off) and equal to DC− when transistor 111 is on (and transistor 112 is off). In both cases, VB remains at substantially 35V above VS due to the bootstrap capacitor 124. Thus, the low-side (external) supply voltage that supplies VCC may be set to 35V and the high-side supply voltage VB may be operated at a maximum voltage of 1535V when DC+, equal to the common mode voltage, is 1500V. DC− is tied to ground/VSS but does not have to be.

It will be appreciated that the common mode voltage and the maximum operating range of the floating supply is configurable and may set at different voltages provided in the above two examples, including common mode voltages between 130-1500V, less than 30V, or greater than 1500V.

The aforementioned voltages are set such that the high-side voltage domain operates in a higher voltage or power domain than that of the low-side voltage domain. In addition, the medium-voltage or power domain is set at an intermediate level between the HV domain and the LV domain.

The HV domain 41 includes pre-driver circuitry 127 and buffer 134 coupled to VS and VB.

The LV domain 143 includes the PWM logic 135 and transmitter circuitry that transmits communication signals to the other voltage domains.

The MV domain 42 includes pre-driver circuitry 126 and buffer 133. It also includes a power management unit (PMU) 137 that is supplied by VSS and VCC. The PMU 137 is a microcontroller that governs and regulates power functions. For starters, the PMU 137 converts the medium supply voltage (i.e., VCC) to a low supply voltage (e.g., 5V) that is supplied to the LV domain 143. In particular, PMU 137 supplies the low supply voltage to the PWM logic 135. The PWM logic 135 uses the low supply voltage to perform its functions. Secondly, the PMU 137 is configured to monitor for faults and turn off the supply to the PWM logic 135 in the event an event occurs. By turning off the supply to the PWM logic 135, the PWM logic 135 is disabled and the high-side transistor 112 is turned off.

Energy transfer between voltage domains may enabled by capacitor 12-3, which has features equivalent to any of the capacitors 12 described herein. The capacitor 12-3 is used as a DC-DC converter to transfer energy from the MV domain 142 and to the HV domain 141 such that power is provided by VCC and delivered to VB via the capacitor 12-3.

As the amount of power transferred by the capacitor 12-3 is low, the capacitor 12-3 may be used to support the bootstrap operated driver to enable a permanently-on high side, also referred to as a 100% duty cycle operation that is impossible to be manage by the bootstrap diode 125 alone since the bootstrap diode 125 is operated at least part of the time in blocking mode. That is, the bootstrap diode 125 will not transfer energy when it is in blocking mode (i.e., the HV domain is at higher voltage than the LV domain). Thus, the capacitor 12-3 can be used to support the bootstrap diode 125 by transferring enough energy to maintain the HV domain circuit (i.e., the HS gate driver 122) operative, while the solution will still rely on the bootstrap diode 125 to transfer the most significant part of the energy required for the HV domain circuit to drive the related load. In this case, the capacitor 12-3 is electrically coupled in parallel to the bootstrap diode 125 between VCC and VB.

Therefore, depending on the voltage rating of the HV domain 141, the capacitor 12-3 may be used alone or in conjunction with a bootstrap diode to deliver power to VB. In other words, the bootstrap diode 125 may be optional in some cases.

The additional numbered embodiments are provided below.

1. A multi-voltage domain device, comprising:
a semiconductor layer comprising a first main surface and a second main surface arranged opposite to the first main surface, wherein the semiconductor layer comprises:
a first region comprising first circuitry that operates in a first voltage domain,
a second region comprising second circuitry that operates in a second voltage domain different than the first voltage domain, and
an isolation region that electrically isolates the first region from the second region in a lateral direction that extends parallel to the first and the second main surfaces,
wherein the isolation region comprises at least one deep trench isolation barrier, each of which extends vertically from the first main surface to the second main surface, and
wherein the isolation region defines a first sidewall of the first region and a second sidewall of the second region that faces the first sidewall; and
at least one first capacitor configured to generate an electric field laterally across the isolation region between the first region and the second region, wherein the at least one first capacitor comprises a first electrode arranged at the first sidewall and a second electrode arranged at the second sidewall and capacitively coupled to the first electrode,
wherein the first electrode and the second electrode are laterally separated by the at least one deep trench isolation barrier.

2. The multi-voltage domain device of embodiment 1, wherein the at least one first capacitor is configured to transmit a capacitive communication signal between the first circuitry and the second circuitry via the electric field.

3. The multi-voltage domain device of embodiment 1, wherein the at least one first capacitor is configured to transfer power from the first circuitry to the second circuitry, across the isolation region, via the electric field to operate the second circuitry.

4. The multi-voltage domain device of embodiment 1, wherein the first electrode and the second electrode extend vertically from the first main surface to the second main surface.

5. The multi-voltage domain device of embodiment 1, wherein:
the first electrode is a first counter-doped edge region of the first region, including the first sidewall, wherein the first electrode is counter-doped with respect to a doping of a body of the first region, and
the second electrode is a second counter-doped edge region of the second region, including the second sidewall, wherein the second electrode is counter-doped with respect to a doping of a body of the second region.

6. The multi-voltage domain device of embodiment 1, wherein:
the first electrode is a conductive coating that is deposited on the first sidewall, and
the second electrode is a conductive coating that is deposited on the second sidewall.

7. The multi-voltage domain device of embodiment 1, wherein:
each of the at least one deep trench isolation barrier is at least partially filled with a dielectric.

8. The multi-voltage domain device of embodiment 7, wherein:
each of the at least one deep trench isolation barrier is at least partially filled with a conductive material that is insulated from the first electrode and the second electrode by the dielectric.

9. The multi-voltage domain device of embodiment 1, wherein:
each of the at least one deep trench isolation barrier is completely filled with a dielectric.

10. The multi-voltage domain device of embodiment 1, wherein:
the semiconductor layer further comprises:
a third region comprising third circuitry that operates in a third voltage domain,
wherein the isolation region electrically isolates the first region, the second region, and the third region from each other in one or more lateral directions that extend parallel to the first and the second main surfaces, and
wherein the isolation region defines a third sidewall of the third region that faces the first region,
the multi-voltage domain device further comprises:
at least one second capacitor configured to generate an electric field laterally across the isolation region between the first region and the third region.

11. The multi-voltage domain device of embodiment 10, wherein the at least one second capacitor comprises the first electrode arranged at the first sidewall and a third electrode arranged at the third sidewall and capacitively coupled to the first electrode.

12. The multi-voltage domain device of embodiment 10, wherein the at least one second capacitor comprises a third electrode arranged at the first sidewall and a fourth electrode arranged at the third sidewall and capacitively coupled to the third electrode.

13. The multi-voltage domain device of embodiment 1, wherein:
the isolation region comprises a plurality of deep trench isolation barriers, and
at least one first capacitor is a chain of capacitors comprising a third electrode arranged laterally between the first electrode and the second electrode within the isolation region, wherein a first deep trench isolation barrier is interposed laterally between the first electrode and the third electrode and a second deep trench isolation barrier is interposed laterally between the second electrode and the third electrode.

14. The multi-voltage domain device of embodiment 1, wherein the multi-voltage domain device is a monolithic device.

15. The multi-voltage domain device of embodiment 1, further comprising:

a wafer insulator layer comprising a third main surface and a fourth main surface arranged opposite to the third main surface, wherein the second main surface of the semiconductor layer is arranged at the third main surface of the wafer insulator layer, and each of the at least one deep trench isolation barrier extends vertically from the first main surface to the third main surface, wherein the wafer insulator layer electrically isolates the first region from the second region.

16. The multi-voltage domain device of embodiment 15, further comprising:

a silicon on insulator (SOI) wafer comprising the semiconductor layer and the wafer insulator layer.

17. A multi-voltage domain device, comprising:

a semiconductor layer comprising a first main surface and a second main surface arranged opposite to the first main surface, wherein the semiconductor layer comprises:

a first region comprising first circuitry that operates in a first voltage domain, a second region comprising second circuitry that operates in a second voltage domain different than the first voltage domain, and an isolation region that electrically isolates the first region from the second region in a lateral direction that extends parallel to the first and the second main surfaces, wherein the isolation region comprises at least one deep trench isolation barrier, and wherein the isolation region defines a first sidewall of the first region and a second sidewall of the second region that faces the first sidewall; and a wafer insulator layer comprising a third main surface and a fourth main surface arranged opposite to the third main surface, wherein the second main surface of the semiconductor layer is arranged at the third main surface of the wafer insulator layer, and each of the at least one deep trench isolation barrier extends vertically from the first main surface to the third main surface, and wherein the wafer insulator layer electrically isolates the first region from the second region;

a semiconductor substrate comprising a fifth main surface that is coupled to the fourth main surface of the wafer insulator layer;

a first capacitor configured to generate a first electric field vertically across the wafer insulator layer, wherein the first capacitor comprises a first electrode arranged in the first region of the semiconductor layer at the second main surface and a second electrode arranged in the semiconductor substrate at the fifth main surface; and a second capacitor connected in series with the first capacitor, the second capacitor configured to generate a second electric field vertically across the wafer insulator layer, wherein the second capacitor comprises a third electrode arranged in the second region of the semiconductor layer at the second main surface and the second electrode arranged in the semiconductor substrate at the fifth main surface.

18. The multi-voltage domain device of embodiment 17, wherein the second electrode extends laterally along the fifth main surface, vertically overlapping with the first electrode, the isolation region, and the third electrode.

19. The multi-voltage domain device of embodiment 17, wherein:

the first electrode is arranged at the first sidewall, and the third electrode is arranged at the second sidewall.

20. The multi-voltage domain device of embodiment 17, wherein the first capacitor and the second capacitor are configured to transmit a capacitive communication signal between the first circuitry and the second circuitry, around the isolation region, via the first electric field and the second electric field.

21. The multi-voltage domain device of embodiment 17, wherein the first capacitor and the second capacitor are configured to transfer power from the first circuitry to the second circuitry, around the isolation region, via the first electric field and the second electric field to operate the second circuitry.

22. The multi-voltage domain device of embodiment 17, wherein:

the first electrode is a first counter-doped region of the first region, wherein the first electrode is counter-doped with respect to a doping of a body of the first region, and the second electrode is a second counter-doped region of the second region, wherein the second electrode is counter-doped with respect to a doping of a body of the second region.

23. The multi-voltage domain device of embodiment 22, wherein:

the third electrode is a third counter-doped region of the semiconductor substrate, wherein the third electrode is counter-doped with respect to a doping of a body of the semiconductor substrate.

24. The multi-voltage domain device of embodiment 17, wherein the multi-voltage domain device is a monolithic device.

25. The multi-voltage domain device of embodiment 17, wherein:

the semiconductor layer further comprises:

a third region comprising third circuitry that operates in a third voltage domain, wherein the isolation region electrically isolates the first region, the second region, and the third region from each other in one or more lateral directions that extend parallel to the first and the second main surfaces, and wherein the isolation region defines a third sidewall of the third region that faces the first region, the multi-voltage domain device further comprises:

a third capacitor connected in series with the first capacitor, the third capacitor configured to generate a third electric field vertically across the wafer insulator layer, wherein the third capacitor comprises a fourth electrode arranged in the third region of the semiconductor layer at the second main surface and the second electrode arranged in the semiconductor substrate at the fifth main surface.

26. The multi-voltage domain device of embodiment 25, wherein the second electrode extends laterally along the fifth main surface, vertically overlapping with the first electrode, the isolation region, the third electrode, and the fourth electrode.

27. The multi-voltage domain device of embodiment 25, wherein:

the first electrode is arranged at the first sidewall, the third electrode is arranged at the second sidewall, and the fourth electrode is arranged at the third sidewall.

28. A multi-voltage domain device, comprising:
a semiconductor layer comprising a first main surface and a second main surface arranged opposite to the first main surface, wherein the semiconductor layer comprises:
a first region comprising first circuitry that operates in a first voltage domain,
a second region comprising second circuitry that operates in a second voltage domain different than the first voltage domain, and
an isolation region that electrically isolates the first region from the second region in a lateral direction that extends parallel to the first and the second main surfaces,
wherein the isolation region comprises a plurality of deep trench isolation barriers, each of which extends vertically from the first main surface to the second main surface, and
wherein the isolation region defines a first sidewall of the first region and a second sidewall of the second region that faces the first sidewall; and
at least one first capacitor configured to generate an electric field laterally across the isolation region, wherein the at least one first capacitor comprises a first electrode arranged in the isolation region electrically isolated from the first sidewall by a first deep trench isolation barrier and a second electrode arranged in the isolation region electrically isolated from the second sidewall by a second deep trench isolation barrier and capacitively coupled to the first electrode,
wherein the first electrode and the second electrode are laterally separated by a third deep trench isolation barrier.

29. The multi-voltage domain device of embodiment 28, wherein the at least one first capacitor is configured to transmit a capacitive communication signal between the first circuitry and the second circuitry via the electric field.

30. The multi-voltage domain device of embodiment 28, wherein the at least one first capacitor is configured to transfer power from the first circuitry to the second circuitry, across the isolation region, via the electric field to operate the second circuitry.

31. The multi-voltage domain device of embodiment 28, wherein the first electrode and the second electrode extend vertically from the first main surface to the second main surface.

32. The multi-voltage domain device of embodiment 28, wherein:
each of the plurality of deep trench isolation barriers is at least partially filled with a dielectric.

33. The multi-voltage domain device of embodiment 32, wherein:
each of the plurality of deep trench isolation barriers is at least partially filled with a conductive material that is insulated from the first electrode and the second electrode by the dielectric.

34. The multi-voltage domain device of embodiment 28, wherein:
each of the plurality of deep trench isolation barriers is completely filled with a dielectric.

35. The multi-voltage domain device of embodiment 28, further comprising:
a back end of line (BEOL) layer stack coupled to the first main surface of the semiconductor layer, the BEOL layer stack comprising a first electrical connection that connects the first circuitry to the first electrode and a second electrical connection that connects the second circuitry to the second electrode.

36. The multi-voltage domain device of embodiment 35, wherein the first circuitry is a transmitter and the second circuitry is a receiver.

37. The multi-voltage domain device of embodiment 28, wherein the multi-voltage domain device is a monolithic device.

38. The multi-voltage domain device of embodiment 28, further comprising:
a wafer insulator layer comprising a third main surface and a fourth main surface arranged opposite to the third main surface,
wherein the second main surface of the semiconductor layer is arranged at the third main surface of the wafer insulator layer, and each of the plurality of deep trench isolation barriers extends vertically from the first main surface to the third main surface,
wherein the wafer insulator layer electrically isolates the first region from the second region.

39. The multi-voltage domain device of embodiment 28, further comprising:
a silicon on insulator (SOI) wafer comprising the semiconductor layer and the wafer insulator layer.

40. The multi-voltage domain device of embodiment 28, wherein:
the first deep trench isolation barrier is a first highly doped silicon region that has a higher doping concentration than a body of the first region, and
the second deep trench isolation barrier is a second highly doped silicon region that has a higher doping concentration than a body of the second region.

While various embodiments have been disclosed, it will be apparent to those skilled in the art that various changes and modifications can be made which will achieve some of the advantages of the concepts disclosed herein without departing from the spirit and scope of the invention. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A multi-voltage domain device, comprising:
   a semiconductor layer comprising a first main surface and a second main surface arranged opposite to the first main surface, wherein the semiconductor layer comprises:
       a first region comprising first circuitry that operates in a first voltage domain,
       a second region comprising second circuitry that operates in a second voltage domain different than the first voltage domain, and
       an isolation region that electrically isolates the first region from the second region in a lateral direction that extends parallel to the first and the second main surfaces,
       wherein the isolation region comprises at least one deep trench isolation barrier, each of which extends vertically from the first main surface to the second main surface, and
       wherein the isolation region defines a first sidewall of the first region and a second sidewall of the second region that faces the first sidewall;
   a wafer insulator layer comprising a third main surface and a fourth main surface arranged opposite to the third main surface,
   wherein the second main surface of the semiconductor layer is arranged at the third main surface of the wafer insulator layer, and each of the at least one deep trench isolation barrier extends vertically from the first main surface to the third main surface,
   wherein the wafer insulator layer electrically isolates the first region from the second region; and
   at least one first capacitor configured to generate an electric field laterally across the isolation region between the first region and the second region, wherein the at least one first capacitor comprises a first electrode arranged at the first sidewall and a second electrode arranged at the second sidewall and capacitively coupled to the first electrode,
   wherein the first electrode and the second electrode are laterally separated by the at least one deep trench isolation barrier.

2. The multi-voltage domain device of claim 1, wherein the at least one first capacitor is configured to transmit a capacitive communication signal between the first circuitry and the second circuitry via the electric field.

3. The multi-voltage domain device of claim 1, wherein the at least one first capacitor is configured to transfer power from the first circuitry to the second circuitry, across the isolation region, via the electric field to operate the second circuitry.

4. The multi-voltage domain device of claim 1, wherein the first electrode and the second electrode extend vertically from the first main surface to the second main surface.

5. The multi-voltage domain device of claim 1, wherein:
   the first electrode is a first counter-doped edge region of the first region, including the first sidewall, wherein the first electrode is counter-doped with respect to a doping of a body of the first region, and
   the second electrode is a second counter-doped edge region of the second region, including the second sidewall, wherein the second electrode is counter-doped with respect to a doping of a body of the second region.

6. The multi-voltage domain device of claim 1, wherein:
   the first electrode is a conductive coating that is deposited on the first sidewall, and
   the second electrode is a conductive coating that is deposited on the second sidewall.

7. The multi-voltage domain device of claim 1, wherein:
   each of the at least one deep trench isolation barrier is at least partially filled with a dielectric.

8. The multi-voltage domain device of claim 7, wherein:
   each of the at least one deep trench isolation barrier is at least partially filled with a conductive material that is insulated from the first electrode and the second electrode by the dielectric.

9. The multi-voltage domain device of claim 1, wherein:
   each of the at least one deep trench isolation barrier is completely filled with a dielectric.

10. The multi-voltage domain device of claim 1, wherein:
    the semiconductor layer further comprises:
        a third region comprising third circuitry that operates in a third voltage domain,
        wherein the isolation region electrically isolates the first region, the second region, and the third region from each other in one or more lateral directions that extend parallel to the first and the second main surfaces, and
        wherein the isolation region defines a third sidewall of the third region that faces the first region,
    the multi-voltage domain device further comprises:
    at least one second capacitor configured to generate an electric field laterally across the isolation region between the first region and the third region.

11. The multi-voltage domain device of claim 10, wherein the at least one second capacitor comprises the first electrode arranged at the first sidewall and a third electrode arranged at the third sidewall and capacitively coupled to the first electrode.

12. The multi-voltage domain device of claim 10, wherein the at least one second capacitor comprises a third electrode arranged at the first sidewall and a fourth electrode arranged at the third sidewall and capacitively coupled to the third electrode.

13. The multi-voltage domain device of claim 1, wherein:
    the isolation region comprises a plurality of deep trench isolation barriers, and
    at least one first capacitor is a chain of capacitors comprising a third electrode arranged laterally between the first electrode and the second electrode within the isolation region,
    wherein a first deep trench isolation barrier is interposed laterally between the first electrode and the third electrode and a second deep trench isolation barrier is interposed laterally between the second electrode and the third electrode.

14. The multi-voltage domain device of claim 1, wherein the multi-voltage domain device is a monolithic device.

15. The multi-voltage domain device of claim 1, further comprising:
 a silicon on insulator (SOI) wafer comprising the semiconductor layer and the wafer insulator layer.

16. A multi-voltage domain device, comprising:
 a semiconductor layer comprising a first main surface and a second main surface arranged opposite to the first main surface, wherein the semiconductor layer comprises:
  a first region comprising first circuitry that operates in a first voltage domain,
  a second region comprising second circuitry that operates in a second voltage domain different than the first voltage domain, and
  an isolation region that electrically isolates the first region from the second region in a lateral direction that extends parallel to the first and the second main surfaces,
  wherein the isolation region comprises a plurality of deep trench isolation barriers, each of which extends vertically from the first main surface to the second main surface, and
  wherein the isolation region defines a first sidewall of the first region and a second sidewall of the second region that faces the first sidewall;
 a wafer insulator layer comprising a third main surface and a fourth main surface arranged opposite to the third main surface,
 wherein the second main surface of the semiconductor layer is arranged at the third main surface of the wafer insulator layer, and each of the plurality of deep trench isolation barriers extends vertically from the first main surface to the third main surface,
 wherein the wafer insulator layer electrically isolates the first region from the second region; and
 at least one first capacitor configured to generate an electric field laterally across the isolation region, wherein the at least one first capacitor comprises a first electrode arranged in the isolation region electrically isolated from the first sidewall by a first deep trench isolation barrier and a second electrode arranged in the isolation region electrically isolated from the second sidewall by a second deep trench isolation barrier and capacitively coupled to the first electrode,
 wherein the first electrode and the second electrode are laterally separated by a third deep trench isolation barrier.

17. The multi-voltage domain device of claim 16, wherein the at least one first capacitor is configured to transmit a capacitive communication signal between the first circuitry and the second circuitry via the electric field.

18. The multi-voltage domain device of claim 16, wherein the at least one first capacitor is configured to transfer power from the first circuitry to the second circuitry, across the isolation region, via the electric field to operate the second circuitry.

19. The multi-voltage domain device of claim 16, wherein the first electrode and the second electrode extend vertically from the first main surface to the second main surface.

20. The multi-voltage domain device of claim 16, wherein:
 each of the plurality of deep trench isolation barriers is at least partially filled with a dielectric.

21. The multi-voltage domain device of claim 20, wherein:
 each of the plurality of deep trench isolation barriers is at least partially filled with a conductive material that is insulated from the first electrode and the second electrode by the dielectric.

22. The multi-voltage domain device of claim 16, wherein:
 each of the plurality of deep trench isolation barriers is completely filled with a dielectric.

23. The multi-voltage domain device of claim 16, further comprising:
 a back end of line (BEOL) layer stack coupled to the first main surface of the semiconductor layer, the BEOL layer stack comprising a first electrical connection that connects the first circuitry to the first electrode and a second electrical connection that connects the second circuitry to the second electrode.

24. The multi-voltage domain device of claim 23, wherein the first circuitry is a transmitter and the second circuitry is a receiver.

25. The multi-voltage domain device of claim 16, wherein the multi-voltage domain device is a monolithic device.

26. The multi-voltage domain device of claim 16, further comprising:
 a silicon on insulator (SOI) wafer comprising the semiconductor layer and the wafer insulator layer.

27. The multi-voltage domain device of claim 16, wherein:
 the first deep trench isolation barrier is a first highly doped silicon region that has a higher doping concentration than a body of the first region, and
 the second deep trench isolation barrier is a second highly doped silicon region that has a higher doping concentration than a body of the second region.

\* \* \* \* \*